United States Patent
Simonis

(10) Patent No.: US 12,366,610 B2
(45) Date of Patent: Jul. 22, 2025

(54) METHOD AND APPARATUS FOR OPERATING A SYSTEM FOR PROVIDING PREDICTED CONFIDENCE INTERVALS FOR STATES OF HEALTH OF ELECTRICAL ENERGY STORES FOR AT LEAST ONE DEVICE WITH THE AID OF MACHINE LEARNING METHODS

(71) Applicant: Robert Bosch GmbH, Stuttgart (DE)

(72) Inventor: Christian Simonis, Leonberg (DE)

(73) Assignee: Robert Bosch GmbH, Stuttgart (DE)

( * ) Notice: Subject to any disclaimer, the term of this patent is extended or adjusted under 35 U.S.C. 154(b) by 542 days.

(21) Appl. No.: 17/812,210

(22) Filed: Jul. 13, 2022

(65) Prior Publication Data

US 2023/0016228 A1   Jan. 19, 2023

(30) Foreign Application Priority Data

Jul. 14, 2021   (DE) .................. 10 2021 207 467.7

(51) Int. Cl.
  *G01R 31/392*   (2019.01)
  *G01R 31/367*   (2019.01)

(52) U.S. Cl.
  CPC ......... *G01R 31/392* (2019.01); *G01R 31/367* (2019.01)

(58) Field of Classification Search
  None
  See application file for complete search history.

(56) References Cited

U.S. PATENT DOCUMENTS

| 8,332,342 B1 | 12/2012 | Saha et al. | |
| 9,407,098 B2 * | 8/2016 | Sebastiani | G01R 31/378 |
| 2015/0046109 A1 * | 2/2015 | Miwa | H01M 10/482 |
| | | | 702/63 |
| 2015/0362559 A1 * | 12/2015 | Hametner | G01R 31/3828 |
| | | | 702/63 |
| 2015/0369874 A1 * | 12/2015 | Park | B60L 58/12 |
| | | | 702/63 |
| 2019/0288344 A1 * | 9/2019 | Nakao | G01R 31/3648 |
| 2020/0284846 A1 * | 9/2020 | Pajovic | G01R 31/396 |
| 2021/0181263 A1 * | 6/2021 | Hametner | G01R 31/367 |
| 2021/0293890 A1 * | 9/2021 | Gorrachategui | G01R 31/367 |
| 2022/0365139 A1 * | 11/2022 | Altaf | G01R 31/367 |

FOREIGN PATENT DOCUMENTS

AT   521643 B1   9/2020

* cited by examiner

*Primary Examiner* — Lina Cordero
(74) *Attorney, Agent, or Firm* — Maginot, Moore & Beck LLP

(57) ABSTRACT

A computer-implemented method predicts a modeled state of health of an electrical energy store having at least one electrochemical unit in a technical device. The method includes providing a data-based state of health model, based on a characteristic of at least one operating variable of the electrical energy store up to a time, to assign the electrical energy store a corresponding state of health for the time and to indicate a corresponding modeling uncertainty, and predicting the characteristic of the at least one operating variable starting from a present time into the future based on a usage pattern model that is determined by a user-specific or usage-specific usage pattern. The method further includes predicting a characteristic of the state of health based on the data-based state of health model and the predicted characteristic, generated in a model-based manner, of the at least one operating variable.

16 Claims, 7 Drawing Sheets

METHOD AND APPARATUS FOR OPERATING A SYSTEM FOR PROVIDING PREDICTED CONFIDENCE INTERVALS FOR STATES OF HEALTH OF ELECTRICAL ENERGY STORES FOR AT LEAST ONE DEVICE WITH THE AID OF MACHINE LEARNING METHODS

This application claims priority under 35 U.S.C. § 119 to patent application no. DE 10 2021 207 467.7, filed on Jul. 14, 2021 in Germany, the disclosure of which is incorporated herein by reference in its entirety.

The disclosure relates to electrical devices operated independently of the mains and having electrical energy stores, in particular electrically driveable motor vehicles, in particular electric vehicles or hybrid vehicles, and also to measures for determining a state of health (SOH) of the electrical energy store. The disclosure furthermore relates not only to mobile but also to stationary electrical energy stores.

BACKGROUND

Energy is supplied to electrical devices and machines operated independently of the mains, such as for example electrically driveable motor vehicles, with the aid of electrical energy stores, generally device batteries or vehicle batteries. These supply electrical energy for operating the devices. Energy converters, such as for example fuel cell systems, including hydrogen tanks, may however also be considered as electrical energy store.

Electrical energy stores or energy converters degrade over their service life and in a manner dependent on their loading or usage. This ageing, as it is known, leads to a continuously decreasing maximum output or storage capacity. The state of health corresponds to a metric for indicating the ageing of energy stores. According to convention, a new energy store has a state of health of 100%, which decreases over the course of its service life in a noticeable manner. An extent of the ageing of the energy store (temporal change in the state of health) is dependent on an individual loading of the energy store, that is to say, in the case of vehicle batteries of motor vehicles, on the usage behavior of a driver, external environmental conditions and on the vehicle battery type.

Although a physical state of health model may be used to determine the present state of health of the energy store based on historical operating state characteristics, this model is inaccurate in certain situations. This inaccuracy of the conventional state of health model hampers prediction of the state of health characteristic. However, the prediction of the characteristic of the state of health of energy stores is an important technical variable, since it allows a financial assessment of a residual value of the energy store. The uncertainty in the prediction is an important variable here, since it quantifies the technical and financial risk, for example in the case of specifying ageing or a breach of warranty.

SUMMARY

According to the disclosure, provision is made for a method for predicting a state of health of an electrical energy store and a device for predicting a state of health of an electrically operable device.

According to a first aspect, provision is made for a computer-implemented method for predicting a modeled state of health of an electrical energy store having at least one electrochemical unit, in particular a battery cell, in a technical device; having the following steps: (i) providing a data-based state of health model that is designed, based on a characteristic of at least one operating variable of the energy store up to a time, to assign the electrochemical energy store a corresponding state of health for the time and to indicate a corresponding modeling uncertainty, (ii) predicting a characteristic for the at least one operating variable starting from a present time into the future based on a usage pattern model that is determined by a user-specific or usage-specific usage pattern, (iii) predicting a characteristic of the state of health with the aid of the data-based state of health model based on the predicted characteristic, generated in a model-based manner, of the at least one operating variable; (iv) determining a confidence interval for the predicted characteristic of the state of health based on the modeling uncertainty of the data-based state of health model and a confidence of the usage pattern model; (v) signaling the predicted characteristic of the state of health and the corresponding confidence interval.

Energy stores within the meaning of this description comprise device batteries, energy converter systems having an electrochemical energy converter having an energy reserve, such as for example fuel cell systems having a fuel cell and an energy reserve.

The state of health of an electrical energy store, in particular a device battery, is usually not measured directly. This would require a number of sensors inside the energy store, which would make the production of such an energy store costly and complex and increase the installation space. In addition, everyday measurement methods for directly determining the state of health in the energy stores are not yet available on the market. The present state of health of an electrical energy store is therefore generally ascertained with the aid of a physical ageing model in a controller separate from the energy store. This physical state of health model is inaccurate in certain situations and usually exhibits model deviations of up to more than 5%.

The inaccuracy of the physical ageing model also means that it is able to indicate only the present state of health of the energy storage unit with limited accuracy. A prediction of the state of health, which is in particular dependent on the mode of operation of the energy store, such as for example on the level and amount of charge flowing into and out of a device battery, and hence on a usage behavior and on usage parameters, would lead to very inaccurate predictions and is not provided for at present.

State of health (SOH) in device batteries is the key variable for indicating a remaining battery capacity or remaining battery charge. The state of health represents a metric of the ageing of the device battery. In the case of a device battery or a battery module or a battery cell, the state of health may be indicated in the form of a capacity retention rate (SOH-C). The capacity retention rate SOH-C is indicated in the form of a ratio of the measured present capacity to an initial capacity of the fully charged battery. As an alternative, the state of health may be indicated in the form of a rise in the internal resistance (SOH-R) with respect to an internal resistance at the beginning of the service life of the device battery. The relative change in internal resistance SOH-R rises as the battery ages.

Approaches that involve providing a user-specific and usage-specific modeling and prediction of a load profile and of the accompanying state of health of the electrical energy store based on a state of health model that uses the characteristics of operating variables from the time of commissioning in order to adapt the state of health in each case in time steps starting from the state of health at the time of commissioning are highly promising. This state of health model may be implemented in a purely data-based manner, but also in the form of a hybrid data-based state of health model. Such a state of health model may be implemented for example in a central processing unit (cloud) and be parameterized or trained with the aid of operating variables from a multiplicity of energy stores of different devices, these being in a communication connection with the central processing unit.

State of health models for ascertaining states of health for electrical energy stores may be provided in the form of a hybrid state of health model, that is to say a combination of a physical ageing model with a data-based model. In the case of a hybrid model, a physical state of health may be ascertained with the aid of a physical or electrochemical ageing model and this may have a correction value applied to it, which correction value results from a data-based correction model, in particular through addition or multiplication. The physical ageing model is based on electrochemical model equations that characterize electrochemical states of a non-linear system of differential equations, continuously calculate same and maps them onto the physical state of health for output in the form of SOH-C and/or in the form of SOH-R. The calculations may typically be performed in the cloud, for example once per week.

The correction model of the hybrid data-based state of health model may furthermore be designed with a probabilistic or artificial intelligence-based regression model, in particular a Gaussian process model, and may be trained to correct the state of health obtained by the physical ageing model. For this purpose, there is therefore a data-based correction model of the state of health for correcting the SOH-C and/or at least one further one for correcting the SOH-R. Possible alternatives to the Gaussian process are other supervised learning methods, such as based on a random forest model, an AdaBoost model, a support vector machine or a Bayesian neural network.

A prediction of the state of health is useful, for example if it is intended to ascertain a remaining residual service life of the energy store and to assess this for example against warranty conditions or $CO_2$ fleet specifications. A transparent assessment of the technical state of the energy store across all vehicles may furthermore contribute to greater transparency when assessing electric vehicles, since the actual historical battery load, for example influenced by bidirectional charging, is generally unknown and is not able to be identified directly from a mileage of the vehicle.

For the accompanying characterization and determination of ageing, the data-based state of health model in connection with a predefined usage pattern, which indicates the type of usage and operation of the electrical energy store, may be continuously queried. For this purpose, starting from the present time, it is necessary to continuously generate "artificial" (predicted) temporal characteristics of operating variables, these being required by the physical ageing model on account of the time integration method for solving the differential equation in order to model a predicted state of health. The predicted characteristic of the state of health is thereby in particular determined starting from the present time. For this purpose, the operating variables are generated either in a manner directly dependent on the identified usage pattern or based on characteristics, derived from the usage pattern, of loading variables from which the characteristics of the required operating variables are generated.

This prediction option advantageously uses the trained state of health model and usage patterns, thereby allowing a more accurate prediction of the state of health than in the case of a purely extrapolating method.

In order to model a state of health of an energy store with the aid of a physical or electrochemical state of health model and optional clarification by a data-based correction model (hybrid state of health model), it is necessary to provide the temporal characteristics of operating variables at a relatively high frequency. These temporal characteristics of the operating variables also have to be provided with as few gaps as possible for the necessary accuracy requirements, that is to say, in order to determine the state of health at the present time for a device battery, it is necessary to provide the temporal characteristics of the battery temperature, the battery current, the battery voltage and the state of charge, in particular at cell level.

The physical/electrochemical model, along with the correction model, is preferably calculated outside the device, since this process is computationally intensive and the required processing power in the or in hardware close to the battery-operated devices is often not sufficient or cannot be adhered to for cost reasons. The temporal characteristics of the operating variables are therefore transferred continuously to a central processing unit outside the device, and the state of health is determined there in accordance with the electrochemical model and the correction model, where applicable. The training for a global ageing model furthermore has to take place in a centralized manner, that is to say in a cloud environment.

For the prediction, starting from the present time or present evaluation period, the at least one operating variable (loading variable), that is to say for example the temporal characteristic of a temperature and/or a current in the case of a battery as energy store, is generated in a usage pattern model.

Furthermore, in order to determine the predicted characteristic of the state of health, the data-based state of health model may be operated with an overall characteristic of the at least one operating variable that comprises the previous characteristic of the at least one operating variable up to the present time and the characteristic, generated in a model-based manner, of the at least one operating variable starting from the present time into the future.

Provision may be made for the usage pattern model to be designed in particular in the form of a data-based model, in particular in the form of a Bayesian LSTM, in order, based on usage parameters of a usage pattern trained in a user-specific or usage-specific manner, to continuously provide a characteristic of the at least one operating variable or a characteristic of at least one loading variable from which the at least one operating variable is able to be generated.

The usage pattern model is thus designed, based on usage parameters of the usage pattern, to continuously learn and output a characteristic of the at least one operating variable or a characteristic of at least one loading variable from which the at least one operating variable is able to be generated. The usage pattern model is thus designed, based on one or more usage parameters that predefine the usage model explicitly or implicitly, that is to say with the aid of a data-based model, to output continuous characteristics of the at least one operating variable. This makes it possible to convert a usage behavior parameterized by the usage pattern into time series of the at least one operating variable. This may be by directly generating the characteristic of the at least one operating variable and/or by generating at least one loading variable that may itself also correspond to a characteristic of the at least one operating variable, wherein a characteristic of the at least one operating variable is generated from the characteristic of the at least one loading variable with the aid of a suitable model. The usage pattern may thus indicate types of loading of the energy store with the aid of the characteristic of the at least one loading variable. The loading variable may indicate at least one current loading in the case of a device battery as energy store. A further loading variable in the case of a device battery as energy store may correspond to a temperature of the device battery.

Provision may be made for the usage pattern, predefined in a user-specific or usage-specific manner, to be used to create predicted time series of the at least one loading variable, in order in particular to predict a state of health or a characteristic of the state of health with the aid of the state of health model.

The usage pattern results from the model parameters of a usage pattern model that is preferably designed in a data-based manner, in particular in the form of a recurrent neural network, such as for example a Bayesian LSTM (LSTM: long short term memory). This is trained by assigning a calendar time indication to the loading variable characteristics or the operating variable characteristics. The usage pattern model then assigns, to a temporal characteristic of the calendar time indication, a corresponding characteristic of the at least one loading variable or the at least one operating variable or generates same, for example continuously in the form of a time series, when the time indication is predefined accordingly. The calendar time indication may indicate the calendar date and a time of day and information to be derived therefrom, such as day of the week, season or month and the like.

The state of health characteristic is thus advanced into the future starting from a present state of health of the device battery under consideration, based on artificial characteristics, created from the present usage pattern, of at least one loading variable and/or at least one operating variable. This gives the predicted state of health characteristic, from which it is possible for example to determine a provisional service life, in particular in the form of a time at which the predicted state of health will fall below a predefined threshold value that indicates the end of service life.

Provision may be made for the electrical energy store to be operated based on the characteristic of the predicted modeled state of health, wherein in particular a remaining service life of the electrical energy store is signaled based on the characteristic of the predicted modeled state of health. Provision may also be made, depending on the remaining service life, for the number of remaining fast-charging cycles to be increased or reduced or for the operating limits (current limit) or operating strategy (derating) to be adapted. The charging strategy may also be adapted depending on ageing or depending on a predicted state of health characteristic. To this end, fast-charging cycles may be permitted or blocked depending on whether the number of remaining fast-charging cycles has been reached.

In particular, in order to determine the predicted characteristic of the state of health, the state of health model may have applied to it an overall characteristic of the at least one operating variable that comprises the previous characteristic of the at least one operating variable up to the present evaluation period and the artificial characteristic of the at least one operating variable starting from the present evaluation period into the future.

One essential criterion for the quality of the prediction of the state of health is the accuracy and reliability of the characteristic, provided by the usage pattern model, of the at least one loading variable and/or the at least one operating variable. To assess this based on the usage pattern model, a characteristic, generated by the usage pattern model, of the at least one operating variable is matched with an actual characteristic of the at least one operating variable that is able to be observed during real operation. Assuming that the uncertainty in the prediction of the characteristic of the at least one operating variable remains unchanged for an individual device, a predicted state of health characteristic determined by the usage pattern model from the artificially generated characteristic of the at least one operating variable is then able to be assessed in terms of its reliability. This is particularly important for being able to determine the reliability of a prediction of a remaining service life of the energy store. The uncertainty in the forecast characteristic of the at least one operating variable in particular makes it possible to indicate a remaining service life range in accordance with the uncertainty.

According to one embodiment, the confidence of the usage pattern model may be ascertained by comparing a time period of an actual characteristic of the at least one operating variable with the one or more predicted characteristics of the at least one operating variable for the corresponding time period, wherein the one or more predicted characteristics of the at least one operating variable is or are in particular performed in each case for a constant forecast horizon.

The one or more predicted characteristics of the at least one operating variable may in particular each be formed by values of the at least one operating variable at forecast target times that are ascertained based on a usage pattern model that is trained with an actual characteristic of the at least one operating variable up to a corresponding forecast start time, wherein the forecast start times lie before the corresponding forecast target times by the corresponding constant forecast horizon.

The confidence of the output of the usage pattern model may furthermore be determined based on a probability density function of the deviations of the actual characteristic of the at least one operating variable, which typically comprises a battery temperature and/or a battery current in the form of a time series, and one of the one or more predicted characteristics of the at least one operating variable for the same period, in particular in the form of a residual or the associated probability density function that characterizes the confidence.

The confidence of the usage pattern model may in particular be determined in the form of a characteristic of the deviations based on the actual characteristic of the at least one operating variable and the plurality of predicted characteristics of the at least one operating variable for the same period for different constant forecast horizons, wherein the deviations between the constant forecast horizons are interpolated in order to obtain the characteristic of the deviation or the uncertainty based on the forecast time of the value, to be predicted, of the state of health.

Provision may be made for the confidence interval, based on the learned probability density function, which may be assigned to a constant forecast horizon, for the predicted characteristic of the state of health, to be indicated by confidence intervals that result from limit state of health characteristics, wherein the limit state of health characteristics result from state of health characteristics for the minimum and the maximum loading of the energy store that are obtained by applying the characteristics of the maximum deviations to the predicted characteristic of the at least one operating variable and that are each those that are furthest away from the nominal state of health trajectory, wherein the model uncertainty of the data-based state of health model is applied to the state of health characteristics thus obtained for the minimum and the maximum loading of the energy store in order to obtain the limit state of health characteristics. As an alternative, stochastic sampling may be performed using a Monte Carlo approach from the learned statistical distribution or defined quantiles.

Through combination with the hybrid ageing model, it is possible to ascertain the prediction confidences separately. To this end, the model uncertainty of the state of health model, which results directly from the correction model (Gaussian process model), and also the driver-specific confidence of the usage pattern model is determined, this being based on how deterministically or stochastically the driver behaves. The confidence of the usage pattern model indicates the reliability of the predicted characteristics, resulting from the usage pattern model, of the at least one loading variable and/or the at least one operating variable.

Provision may be made for the technical device, and in particular the electrical energy store, to be operated based on the characteristic of the predicted modeled state of health and based on the confidence interval, wherein in particular a remaining service life of the electrical energy store is signaled based on the characteristic of the predicted modeled state of health and/or a range of the possible remaining service life is signaled based on the characteristic of the predicted modeled state of health and the confidence interval, wherein in particular the number of remaining, permitted fast-charging cycles is increased or reduced or current and derating limits for the operation of the energy store are optimized based on the range of the possible remaining service life of the energy stores.

Predictive maintenance intervals may also be adapted based on the confidence of the usage pattern model. For example, in the case of a vehicle battery as energy store of a vehicle as technical device, the maintenance interval may be set for example to 2 years instead of 1.5 years when the confidence of the usage pattern model is low, thus allowing a good prediction of the state of health.

The energy store may be used to operate a device, such as a motor vehicle, a pedelec, an aircraft, in particular a drone, a machine tool, a consumer electronics device, such as a cell phone, an autonomous robot and/or a domestic appliance.

According to a further aspect, provision is made for an apparatus for predicting a modeled state of health of an electrical energy store having at least one electrochemical unit, in particular a battery cell, in a technical device; wherein the apparatus is designed to: (i) provide a data-based state of health model that is designed, based on a characteristic of at least one operating variable of the energy store up to a time, to assign the electrochemical energy store a corresponding state of health for the time and to indicate a corresponding modeling uncertainty, (ii) predict a characteristic for the at least one operating variable starting from a present time into the future based on a usage pattern model that is determined by a user-specific or usage-specific usage pattern, (iii) predict a characteristic of the state of health with the aid of the data-based state of health model based on the predicted characteristic, generated in a model-based manner, of the at least one operating variable; (iv) determine a confidence interval for the predicted characteristic of the state of health based on the modeling uncertainty of the data-based state of health model and a confidence of the usage pattern model; (v) signal the predicted characteristic of the state of health and the corresponding confidence interval.

BRIEF DESCRIPTION OF THE DRAWINGS

Embodiments are explained in more detail below with reference to the appended drawings, in which.

DETAILED DESCRIPTION

The method according to the disclosure is described below on the basis of vehicle batteries as electrical energy store in a multiplicity of motor vehicles as devices of the same type. A data-based state of health model for the respective vehicle battery may be implemented in a control unit in the motor vehicles. The state of health model may, as described below, be continually updated or retrained in a central processing unit outside the vehicle based on operating variables of the vehicle batteries from the vehicle fleet. The state of health model is operated in the central processing unit and is used to calculate and predict ageing.

The example above is representative of a multiplicity of stationary or mobile devices with a mains-independent energy supply, such as for example vehicles (electric vehicles, pedelecs, etc.), installations, machine tools, domestic appliances, IOT devices and the like, that are connected to a central processing unit (cloud) outside the device by way of an appropriate communication connection (for example LAN, Internet).

Figure 1:
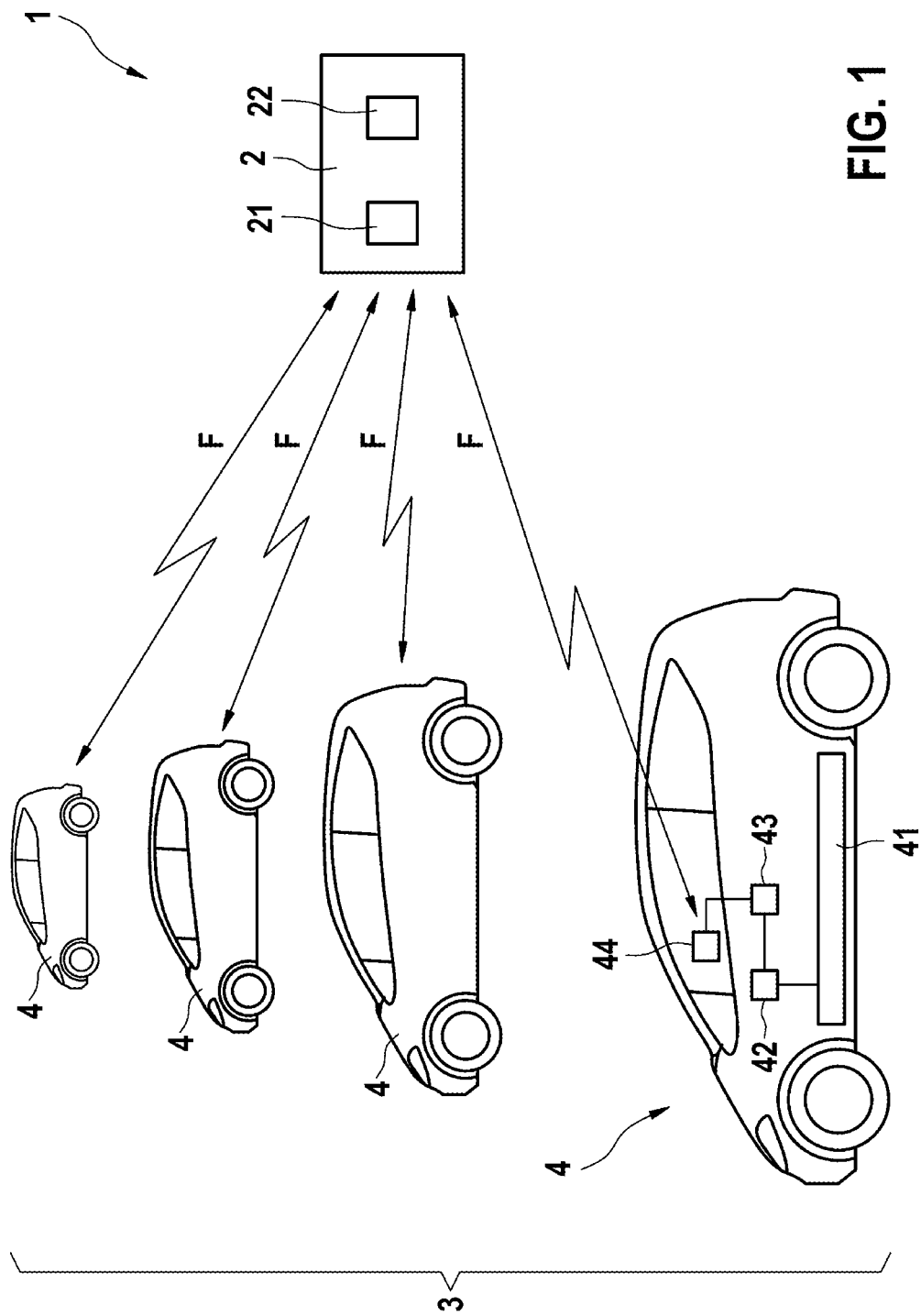
FIG. 1 shows a schematic illustration of a system for providing driver-specific and vehicle-specific operating variables for determining a state of health of a vehicle battery in a central processing unit.

FIG. 1 shows a system 1 for collecting fleet data in a central processing unit 2 for the purpose of creating and operating and also evaluating a state of health model. The state of health model is used to determine a state of health of an electrical energy store, such as for example a vehicle battery or a fuel cell in a motor vehicle. FIG. 1 shows a vehicle fleet 3 with multiple motor vehicles 4.

One of the motor vehicles 4 is illustrated in more detail in FIG. 1. The motor vehicles 4 each have a vehicle battery 41 as a rechargeable electrical energy store, an electric drive motor 42 and a control unit 43. The control unit 43 is connected to a communication module 44 that is suitable for transferring data between the respective motor vehicle 4 and a central processing unit 2 (a so-called cloud).

The motor vehicles 4 transmit the operating variables F, which at least indicate variables that influence the state of health of the vehicle battery 41, to the central processing unit 2. In the case of a vehicle battery, the operating variables F may indicate a present battery current, a present battery voltage, a present battery temperature and a present state of charge (SOC) at pack, module and/or cell level alike. The operating variables F are captured in a fast time frame of between 0.1 Hz and 100 Hz and may be transferred to the central processing unit 2 in uncompressed and/or compressed form on a regular basis. For example, the time series may be transferred to the central processing unit 2 in blocks at intervals of 10 min up to several hours using compression algorithms for the purpose of minimizing data traffic to the central processing unit 2.

The central processing unit 2 has a data processing unit 21, in which the method described below is able to be executed, and a database 22 for storing data points, model parameters, states and the like.

A state of health model that is partially data-based as a hybrid model is implemented in the central processing unit 2. The state of health model may be used on a regular basis, that is to say for example after the respective evaluation duration has elapsed, to ascertain the present state of health of the vehicle battery 41 in question of the associated vehicle fleet based on the temporal characteristics of the operating variables (each since commissioning of the respective vehicle battery) and operating features ascertained therefrom. In other words, it is possible, based on the characteristics of the operating variables of one of the vehicle batteries 41 of the motor vehicles 4 of the associated vehicle fleet 3 and the operating features resulting from these characteristics of the operating variables, to ascertain a state of health of the vehicle battery 41 in question.

State of health (SOH) is the key variable for indicating a remaining battery capacity or remaining battery charge. The state of health is a metric of the ageing of the vehicle battery or of a battery module or of a battery cell and may be indicated as a capacity retention rate (SOH-C) or as a rise in internal resistance (SOH-R). The capacity retention rate SOH-C is indicated as a ratio of the measured present capacity to an initial capacity of the fully charged battery. The relative change in internal resistance SOH-R rises as the battery ages.

Figure 2:
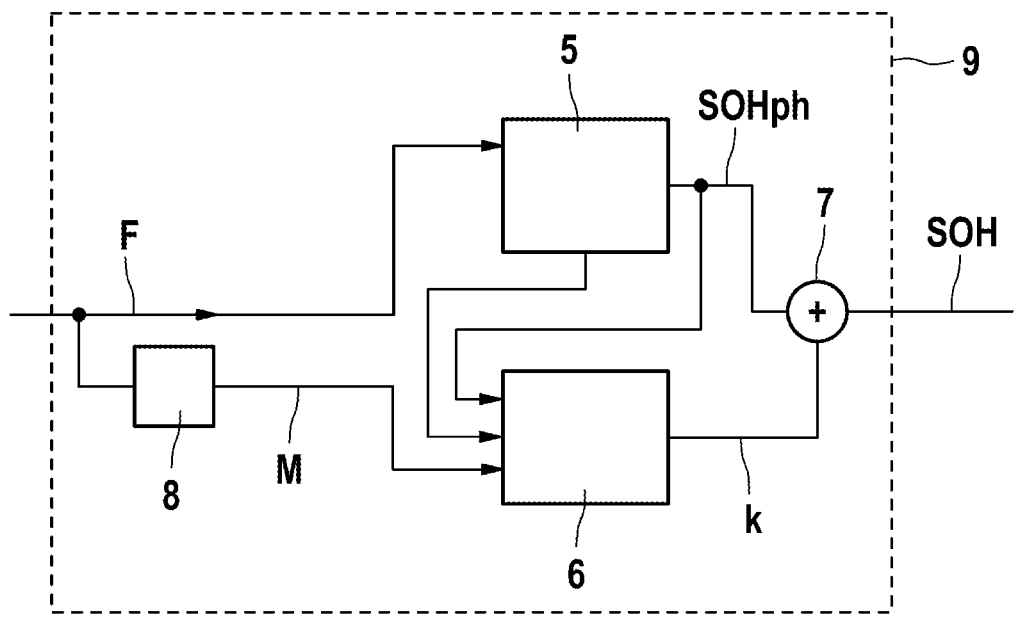
FIG. 2 shows a schematic illustration of a functional structure of a hybrid state of health model.

FIG. 2 schematically shows, by way of example, the functional structure of one embodiment of a data-based state of health model 9 that is structured in a hybrid manner. The state of health model 9 comprises a physical ageing model 5 and a correction model 6.

The physical ageing model 5 is a non-linear mathematical model based on differential equations. Evaluating the physical ageing model of the state of health model with operating variable characteristics, in particular since the start of the service life of the device battery, leads to the creation of an internal state of the system of equations of the physical differential equations that corresponds to a physical internal state of the device battery. Since the physical ageing model is based on physical and electrochemical laws, the model parameters of the physical ageing model are variables that indicate physical properties.

The time series of the operating variables F are thus incorporated directly into the physical state of health model 5, which is preferably in the form of an electrochemical model and describes corresponding internal electrochemical states, such as layer thicknesses (for example SEI thickness), change in cyclable lithium due to anode/cathode side reactions, fast consumption of electrolyte, slow consumption of electrolyte, loss of active material in the anode, loss of active material in the cathode, etc. with the aid of non-linear differential equations and a multidimensional state vector.

The physical ageing model 5 thus corresponds to an electrochemical model of the battery cells and the cell chemistry. This model, based on the operating variables F, ascertains internal physical battery states in order to provide a physically based state of health SOHph with a dimension of at least one in the form of the abovementioned electrochemical states, which are mapped linearly or non-linearly onto a capacity retention rate (SOH-C) and/or an internal resistance rise rate (SOH-R) in order to provide same as a state of health (SOH-C and SOH-R).

The model values provided by the electrochemical model for the physical state of health SOHph are however inaccurate in some situations, and provision is therefore made to correct these with a correction variable k. The correction variable k is provided by the data-based correction model 6 that is trained with the aid of training datasets from the vehicles 4 of the vehicle fleet 3 and/or with the aid of laboratory data.

The correction model 6 receives, at input, operating features M that are ascertained from the characteristics of the operating variables F and may also comprise one or more of the internal electrochemical states of the system of differential equations of the physical model. The correction model 6 may furthermore receive, at input, the physical state of health SOHph obtained from the physical ageing model 5. The operating features M of the present evaluation period are generated in a feature extraction block 8 based on the time series of the operating variables F. The operating features M also include the internal states from the state vector of the electrochemical physical ageing model and, advantageously, the physical state of health SOHph.

Operating features M that relate to an evaluation period may be generated from the operating variables F in the central processing unit 2 for each vehicle fleet 3, or in other embodiments also in the respective motor vehicles 4 already. The evaluation period for determining the state of health may be between a few hours (for example 6 hours) and several weeks (for example one month). A customary value for the evaluation period is one week.

The operating features M may for example comprise features referenced to the evaluation period and/or accumulated features and/or statistical variables ascertained over the entire previous service life. In particular, the operating features may for example comprise: electrochemical states, such as for example SEI layer thickness, change in cyclable lithium due to anode/cathode side reactions, fast consumption of electrolyte solvent, slow consumption of electrolyte solvent, lithium deposition, loss of active anode material and loss of active cathode material, information about impedances and internal resistances, histogram features, such as temperature over state of charge, charge current over temperature and discharge current over temperature, in particular multidimensional histogram data in relation to battery temperature distribution over state of charge, state of charge distribution over temperature and/or discharge current distribution over temperature, current throughput in ampere-hours, accumulated overall charge (Ah), an average capacity increase during a charging process (in particular for charging processes in which the charge increase is above a threshold proportion [for example 20% $\Delta$SOC] of the overall battery capacity), charge capacity and an extreme value (for example maximum) of the differential capacity during a measured charging process with a sufficiently large rise in the state of charge (smoothed characteristic of dQ/dU: change in charge divided by change in battery voltage) or accumulated mileage. These variables are preferably converted such that they characterize the real usage behavior as best possible and normalize it in the feature space. All or only some of the operating features M may be used for the method described below.

To determine a corrected state of health SOH to be output, the outputs SOHph, k of the physical ageing model 5 and of the data-based correction model 6, which is preferably implemented as a Gaussian process model, are applied to one another. These may in particular be added or otherwise also multiplied (not shown) in a summing block 7 in order to obtain the modeled state of health SOH, to be output, at a present evaluation period. The confidence of the Gaussian process may additionally furthermore be used as confidence of the corrected ageing value SOH, to be output, of the hybrid model. The confidence of the Gaussian process model thus characterizes the modeling uncertainty of the mapping of operating feature points or principal components (when using PCA) onto a state of health.

PCA (principal component analysis) may possibly be used to scale and reduce the dimensions of the operating features in order accordingly to reduce redundant linear-dependent information in the feature space prior to the training of the correction model (unsupervised). As an alternative, kernel PCA may also be used in order also to be able to map non-linear effects in the complexity reduction of the data. The entire operating feature space (or the principal component space) is normalized both before the dimension reduction and especially thereafter, for example using min/max scaling or Z-transformation.

It is therefore possible to calculate the state of health and predict the state of health for energy stores having at least one electrochemical unit, for example a battery cell. The method is also applicable to the overall system of the energy store using rule-based and/or data-based mapping. Using the example of the battery, the ageing prediction, in addition to cell level, may also be applied directly to module level and pack level. In addition or as an alternative, the weakest cell in an energy store system may also be adopted as limiting component for the battery pack.

Figure 3:
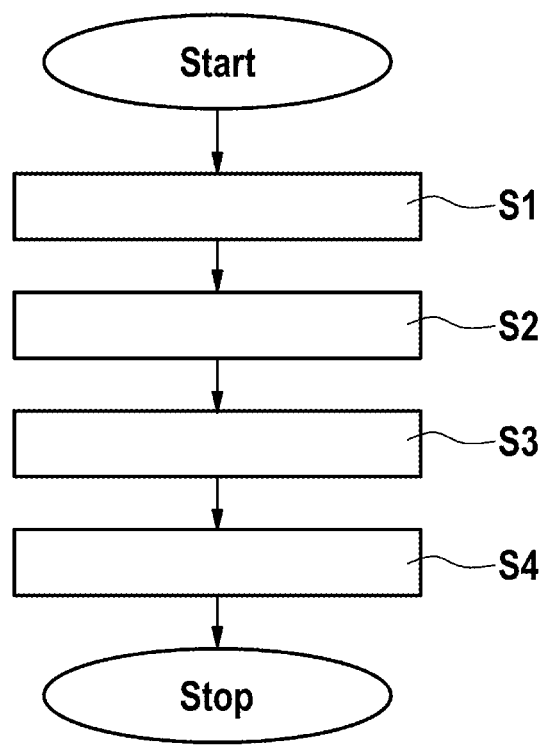
FIG. 3 shows a flowchart for illustrating a method for training a data-based state of health model.

FIG. 3 shows a flowchart for explaining an exemplary method for training the hybrid state of health model in the central processing unit 2. For this purpose, training datasets are defined, these assigning characteristics of operating variables to an empirically ascertained state of health in the form of a label.

A state of health in the form of a label may be ascertained in a manner known per se by evaluating the operating variable characteristics with an additional model in the vehicle or in the central processing unit 2 under defined load conditions and environmental conditions for label generation, such as for example in a workshop, on a test bench or a diagnostic or label generation mode, which constitutes an operating mode and guarantees compliance with predetermined operating conditions of the vehicle battery, such as for example constant temperature, constant current and the like. Other models for ascertaining the state of health may be used for this purpose, for example based on the analysis of an identified charging and/or discharging phase of the battery usage.

An SOH-C measurement is preferably performed through coulomb counting or by forming a temporal current integral during the charging process, this being divided by the rise in the state of charge between the beginning and the end of the charging and/or discharging phase in question. The calibration in this place preferably takes place on the no-load voltage characteristic curve in quiescent phases in order to jointly calculate the state of charge characteristic in the central processing unit. A sufficiently reliable indication about the state of health for use as a label may for example be obtained when the vehicle battery is brought from a fully discharged state of charge to a fully charged state during a charging process from a defined relaxed state under reproducible load conditions and environmental conditions. The maximum charge thereby acquired may be correlated with an initial maximum charging capacity of the vehicle battery. Resistance-related states of health (SOH-R values) may also be calculated by voltage changes with respect to a current change. These usually refer to a defined time interval and defined environmental conditions and the direction of energy flow in the system.

A training dataset for a vehicle battery thus results from the respective state of health ascertained at a time and the operating variable characteristics for the vehicle battery in question from the commissioning time of the vehicle battery in question up to this time. Multiple training datasets may be ascertained at various times for a vehicle battery, wherein the times may be indicated in relation to the commissioning time (start of service life). The training datasets are collected and provided for the multiplicity of vehicles.

The state of health model may be trained with the training datasets in a conventional manner. For this purpose, provision is made for the correction model 6 to be trained on the residual of the physical model, such that the correction model is able to perform appropriately data-driven corrections precisely where the data situation allows this with sufficient confidence. The training datasets then constitute the training set.

The training may take place by dividing the training datasets into a training set and a test set. The training set is used to train the hybrid state of health model, while the test set is used to validate the hybrid state of health model with the aid of new unknown data from the test set that are not used for the training. A third dataset, the validation dataset, may preferably be used to optimize the hyperparameters of the correction model.

In step S1, the physical ageing model 5 is parameterized based on a first part of the training set, in particular through parameter optimization with the aid of the least squares method or the like. The physical state of health SOHph as output from the physical ageing model 5 is in this case adopted as the state of health of the respective training dataset.

In step S2, the physical ageing model is applied to the entire training set of the hybrid model, that is to say a number of training datasets that comprises at least the set of training datasets with which the physical ageing model has been parameterized or even goes beyond this. The error of the physical ageing model 5 is accordingly evaluated in the form of a histogram of the model deviation in an overall error in relation to the residual. This residual, in combination with the operating features M or the operating variables F, contains all relevant information in relation to the systematic weaknesses of the physical ageing model 5. This also gives the information as to how the physical ageing model 5 behaves in relation to new training datasets not used to parameterize the physical ageing model 5, that is to say how it generalizes.

In a next step S3, the data-based correction model 6 is trained on the complete training set of the hybrid state of health model 9. This training set of the hybrid model comprises at least the training set of the physical model in accordance with step S1. To train the correction model 6, the operating features M are extracted from the operating variables F and also the internal states of the physical ageing model 5 are used as a subset of M in order to map all of the operating features onto an error between the model prediction (physical state of health) of the physical ageing model and the labelled state of health in accordance with the training dataset. M may furthermore also comprise the modeled physical state of health SOHph. The correction model 6 may thereby learn the weaknesses of the physical ageing model 5, in order thereby to be able to make a correction to the physical state of health in the correction block.

The data-based correction model 6 may be trained through cross-validation and sequential bagging (bootstrap aggregating) in order to improve robustness and accuracy. When the correction model is trained, the trained hybrid state of health model may be validated with the aid of the test set in step S4, such that the overall performance is able to be validated for the state of health calculation.

The trained hybrid state of health model may then be used to ascertain the state of health on the basis of the temporal characteristics of operating variables F of a vehicle battery since the start of service life.

The training of the hybrid state of health model may be initiated whenever new labelled training datasets are available, especially when they contain new and relevant information. It is thus possible to continuously retrain the hybrid state of health model to ascertain the present state of health of a vehicle battery and to use it in a prediction of the state of health during operation in a central processing unit 2 based on fleet data.

The training data may be ascertained with the aid of "representative active learning", wherein training data in relation to operating feature points (combination of operating features) for which the correction model exhibits a high degree of uncertainty are ascertained. The devices from the group of devices whose operating feature points exhibit a high degree of modeling uncertainty and at the same time have high relevance to the existing vehicle fleet 3 may in particular be selected, such that the greatest possible number of vehicles 4 of the vehicle fleet 3 in question profit from a label generation and subsequent model training.

Figure 4:
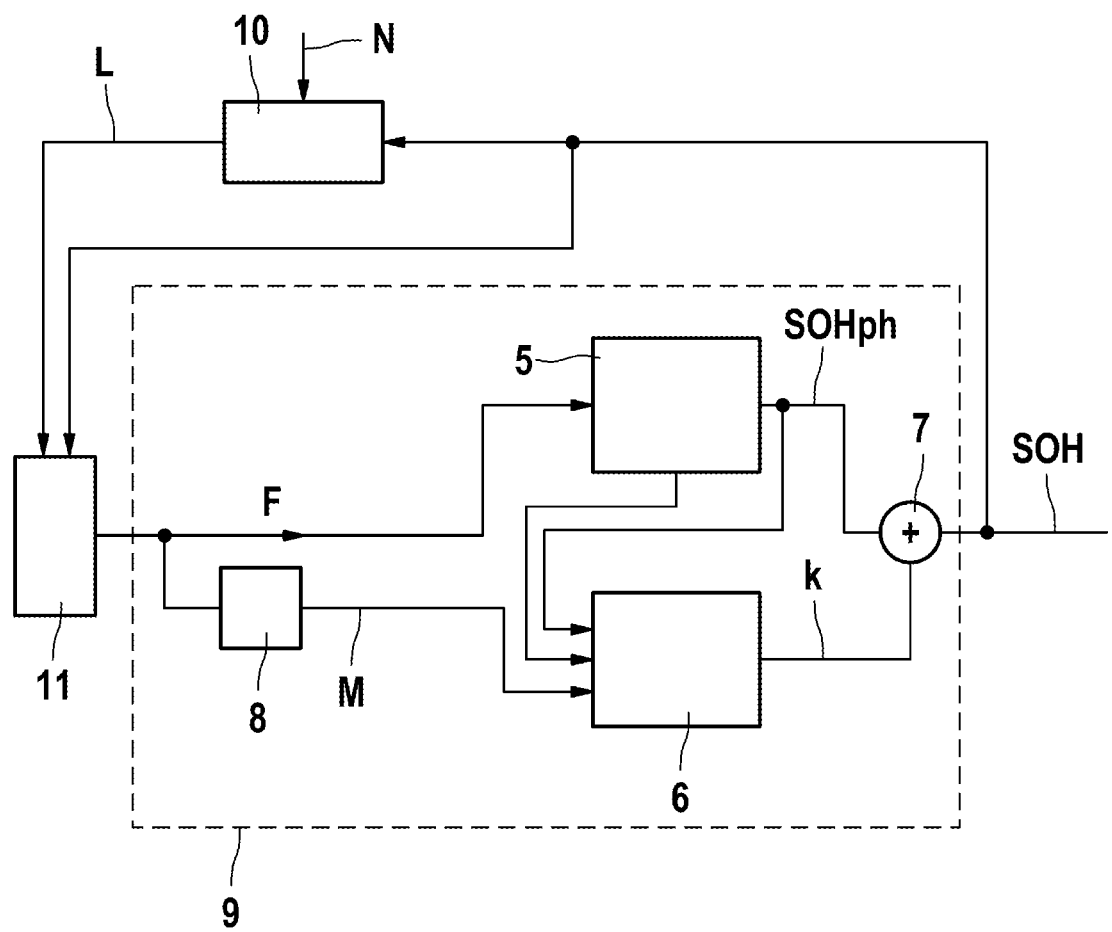
FIG. 4 shows a schematic illustration of a functional structure of a hybrid state of health model with usage-dependent prediction of the state of health.

FIG. 4 is based on the hybrid state of health model from FIG. 2. To predict a future state of health characteristic, use is made of a dynamic model 9 in order to generate temporal characteristics of operating variables, such as the battery voltage U and the state of charge SOC, on the basis of a characteristic of at least one loading variable L, such as for example the characteristic of the battery current I and the battery temperature T, and to provide all of these operating variables together, specifically the temporal characteristics of the battery voltage U, of the state of charge SOC, of the battery current I and possibly of the battery temperature T, to the hybrid state of health model 9 as "artificial" operating variable characteristics F.

For batteries as energy stores, the characteristics of the generated loading variables L thus correspond to some or else all of the "artificial" operating variable characteristics. In the case of other types of energy stores, the loading variables L may differ from the operating variables generated therefrom. In other embodiments, the characteristics of the operating variables may also correspond in full to the loading variables and thus be generated directly from a usage pattern model 10, as described below.

The dynamic model 9 is thus tasked with providing time series or characteristics, which are generated (not real, artificially generated) for the hybrid state of health model in the prediction case, of loading variables L in order to create operating variables and/or as at least some of the operating variables F, by way of which it is possible to make a prediction for the characteristic of the state of health by advancing the present state of health (based on the characteristics of the operating variables captured since the start of service life (commissioning)).

The dynamic model 9 may be designed in various forms, such as for example an equivalent circuit diagram, an electrochemical model, a single particle model of battery cells or the like. The dynamic model 9 may in particular correspond to an electrochemical battery model that models states of equilibrium and calibrates to cell voltages in quiescent phases in order to generate a battery current and state of charge from a battery voltage. As an alternative, the dynamic model may be implemented in the form of a battery performance model for characterizing the system transfer function, wherein the non-linearity of the current strength is removed through Butler-Volmer tuning.

The generation of the operating variable characteristics from the characteristics of the loading variables L takes place on the basis of the resulting state of health SOH of the vehicle battery 41, which updates the dynamic model 9, especially in relation to its parameters or, alternatively, its states. The transfer behavior of the dynamic model 9 thus changes on the basis of the state of health of the vehicle battery 41. This parameter update typically takes place once per (simulated) month during a simulation or prediction.

The state of health SOH is taken into consideration by updating either parameters and/or states of the dynamic model 9 on the basis of the calculated modeled state of health SOH.

For the example of the battery performance model, the battery voltage is determined from the cell voltages $U_{cell}$ as follows:

$$U_{cell} = OCV(SOC) + R1(SOH) * (U_{ohmic} + U_{ct}) R2(SOH) * U_{diff}$$

wherein OCV corresponds to the no-load voltage, $U_{ohmic}$ corresponds to the voltage drop across the battery cell due to ohmic resistance, $U_{ct}$ corresponds to the voltage drop based on charge exchange resistance, $U_{diff}$ corresponds to the voltage drop based on diffusion resistance, and R1(SOH) and R2(SOH) correspond to the parameters to be optimized. In this case, $R1 = R_{ohmic} + R_{ct}$ (T, I) is parameterized for the high-frequency component and R2 is parameterized for the low-frequency component. $R_{ct}$ ((CT=charge transfer) describes the non-linear component of the transfer function due to the non-linear dependency of the current strength.

$$R_{ct}(T, I_0, I) = R_{ct0}(T) \cdot f1(T, I_0, I)$$

$I_0$ corresponds to the current in the dynamic state of equilibrium. At this operating point, the resistance is able to be linearized with sufficient accuracy using the Butler-Volmer equation.

In order to generate the characteristics of the loading variables L for the prediction of the state of health, provision is made for the usage pattern model 10. The usage pattern model 10 converts predefined usage patterns N into characteristics of loading variables L that reflect the loading of the energy store to which the energy store is exposed in the usage and operating mode indicated by the usage pattern. The usage patterns N thus lead to the outputting of a temporal characteristic of a battery current I and a battery temperature T as loading variables L by the usage pattern model 10, by way of which, with the aid of the dynamic model 9, the set of operating variables (F) is supplemented with the characteristics of the battery voltage U and the state of charge SOC in order to generate the artificially generated characteristics of the operating variables.

The usage patterns are defined by usage parameters N that are learned by the usage pattern model 10 in a vehicle-specific manner, preferably with the additional aid of data-based methods, and are used to simulate the typical usage behavior of an individual user or a drivetrain operated by a user in relation to the vehicle battery 41 in question.

The usage pattern model 10 may be in the form of a recurrent neural network, such as for example an LSTM or GRU, in particular in the form of a Bayesian LSTM network, and be trained based on characteristics of loading variables L or operating variables F that indicate a typical and representative type of use of the energy store. The characteristics of loading variables L or operating variables F to be taken into consideration in this case should be based on a period of the same type of use and same type of operation of the vehicle battery 41.

The usage parameters, which indicate the usage pattern, then correspond to the model parameters of the usage pattern model 10 and therefore characterize implicit and explicit usage patterns of a driver or usage types of the vehicle, that is to say in the case of an artificial neural network for example the weightings and bias values of the individual neurons. Prior and posterior distributions and probabilities that are made conditional on observations in accordance with Bayes' theorem may also be taken into consideration as relevant parameters.

The usage patterns result from training of the usage pattern model 10 based on known temporal characteristics of the loading variables L and/or the operating variables F in relation to their calendar relationship. In other words, the usage pattern model 10 is trained at input with a calendar time indication and at output with the loading variables (current, temperature, preferably in the form of a time series) and/or the operating variables in a manner known per se for recurrent neural networks.

The usage pattern model 10 may be in the form of an overall model or have a sub-model for each characteristic, to be predicted, of a loading variable L. In this case, a sub-model of the usage pattern model 10 is trained on the driver-specific temporal temperature characteristic and a further sub-model of the usage pattern model 10 is trained on the driver-specific current characteristic, in order to be able to assign these to a calendar reference variable or time indication through simulation and provide same. By specifying a calendar time indication, such as the date and a time of day, it is thus possible to generate an artificial characteristic of the loading variables and/or the operating variables. The calendar time indication may furthermore contain the day of the week, the month and knowledge about bank holidays, and in particular take into consideration seasonalities through feature engineering.

The usage pattern model may regularly be trained taking into consideration new data, for example once per month, as long as no driver change has been detected. The training dataset may in this case typically comprise characteristics of operating variables or loading variables since the last identified driver change up to the most recently captured operating variables or loading variables. In the middle of this section, a time period is typically extracted from the training dataset and is not used for training, but rather to validate the usage pattern model. A Bayesian LSTM network is typically used for the driver-specific characterization of the current characteristic. A Bayesian LSTM network is furthermore used for the driver-specific characterization of the temperature characteristic. ARIMAX models are alternatives to the LSTM approach.

The usage pattern model 10 may thus be formed directly from raw data of the characteristics of the loading variables L and/or the operating variables F. Typical patterns of the current profile, for example due to recurrent commutes and typical downtimes and rest times and loads in relation to temperature ranges, are thus identified and made reproducible for the vehicle battery 41.

The usage patterns N may thus implicitly indicate types of loading of the vehicle battery 41, in particular periodic loading.

The usage pattern N may in particular also indicate environmental conditions and a periodic loading characteristic. The environmental conditions may be derived for example from a climate chart, indicate a characteristic of the battery temperature within a day/night cycle, for the seasons and the like, preferably with the additional aid of GPS-dependent weather data from the central processing unit (cloud). To this end, the usage pattern model may be trained and used, in addition to the calendar time indication, with a temperature characteristic indication. Predictions of GPS-dependent temperature characteristics may preferably be incorporated into the prediction of the usage patterns.

The temperature characteristic indication may result from an average temperature in a directly preceding period, such as for example one month, which may be predicted with the aid of seasonal fluctuations that result from a climate chart. The climate chart may be derived from a location indication (geoposition) of the vehicle (vehicle location: location indication of the most commonly observed vehicle position). The usage pattern model thus makes provision to map the calendar time indication and the temperature characteristic indication onto the characteristics of the loading variables and/or the operating variables as input variable, and is also trained accordingly.

The usage pattern model 10 may additionally be operated based on the modeled state of health SOH. It may thus be taken into consideration, for example in the case of a vehicle operated by the vehicle battery, that a driver, in the case of an old battery, will have to perform charging more like three times per week, instead of only twice as he did initially, in order to cover his desired route.

The usage patterns N are trained and predefined in a vehicle-specific manner and characterize the type of usage and operation or the usage and operating behavior of the respective vehicle batteries 41.

The usage pattern N, which is predefined in the form of the usage parameters (model parameters) of the usage model pattern 10, may have its plausibility checked in the form of gradient characteristics of cumulative operating features for cumulative variables for which linear growth is expected in the case of the same type of usage or operation, such as for example the mileage or the efficiency-normalized AH throughput, for example taking into consideration the SOH-R.

The prediction quality of the usage pattern model 10 depends to a considerable extent on the availability of sufficient training data. In particular in the case of newly commissioned vehicles or vehicle batteries 41, there are generally not yet any data about characteristics of operating variables and loading variables for a sufficient duration to model the usage pattern model 10 with sufficient accuracy in the above-described training method.

The method described below therefore makes provision to learn and to assess the modeling uncertainty of the prediction of the characteristics of the loading variables L and/or the operating variables F in order to be able to assess the overall confidence of the prediction, based thereon, of the state of health or ascertainment of the remaining service life. To this end, the method uses the fleet data from the multiplicity of vehicles in order to determine the quality of the forecast (confidence) of loading variables L and/or operating variables F. From the vehicle-specific forecast quality regarding the usage behavior, that is to say the prediction of the characteristics of the at least one loading variable and/or the at least one operating variable, it is possible to statistically derive an uncertainty of the prediction of the driver-specific loading variables, comprising for example temperature and current, which is used to assess the resulting prediction, including the modeling uncertainty of the state of health model, taking into consideration the modeling confidence of the usage pattern model 10. It may in particular be assessed how well the forecast is able to replicate and predict a particular type of driver. It is also possible to perform a statistically secure confidence assessment of the prediction of the state of health.

Through combination with the hybrid state of health model, it is possible to split the prediction confidences between modeling uncertainty of the state of health model, which is determined directly from the correction model (Gaussian process model), and the confidence of the driver-specific usage pattern model, which is dependent on how deterministically or stochastically the driver behaves.

Figure 5:
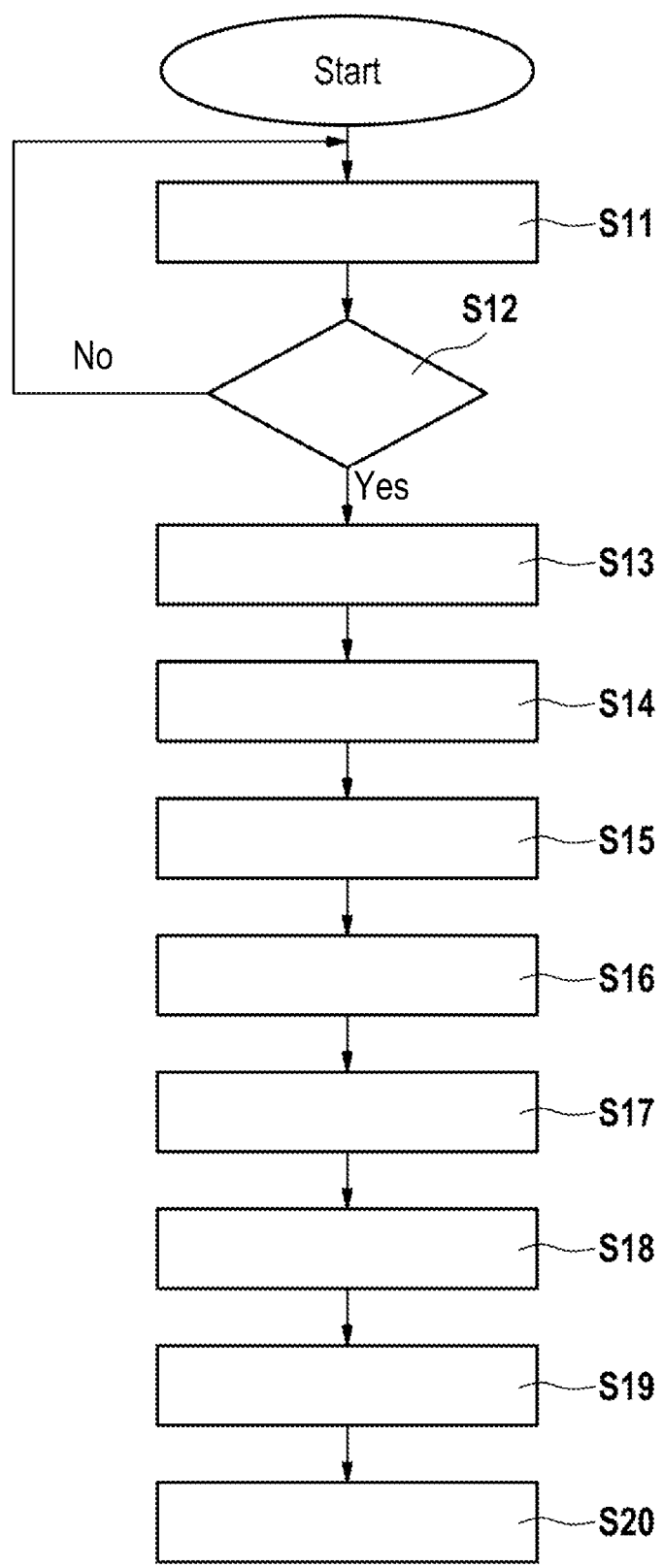
FIG. 5 shows a flowchart for explaining a method for ascertaining a predicted characteristic of a state of health of a vehicle battery as energy store.

The method is executed in the central unit 2 and described in more detail below with reference to the flowchart of FIG. 5.

In step S11, the central processing unit 2 operates as normal. During operation, characteristics of operating variables, such as for example battery current, battery voltage, state of charge and battery temperature, are in this case transferred continuously from each of the vehicles 4 of the vehicle fleet 3 to the central processing unit 2.

In step S12, a check is performed as to whether a prediction of the state of health should be performed for a vehicle battery 41 of a particular vehicle 4.

If this is the case (alternative: Yes), the method continues with step S13, otherwise (alternative: No), there is a return to step S11.

Figure 6:
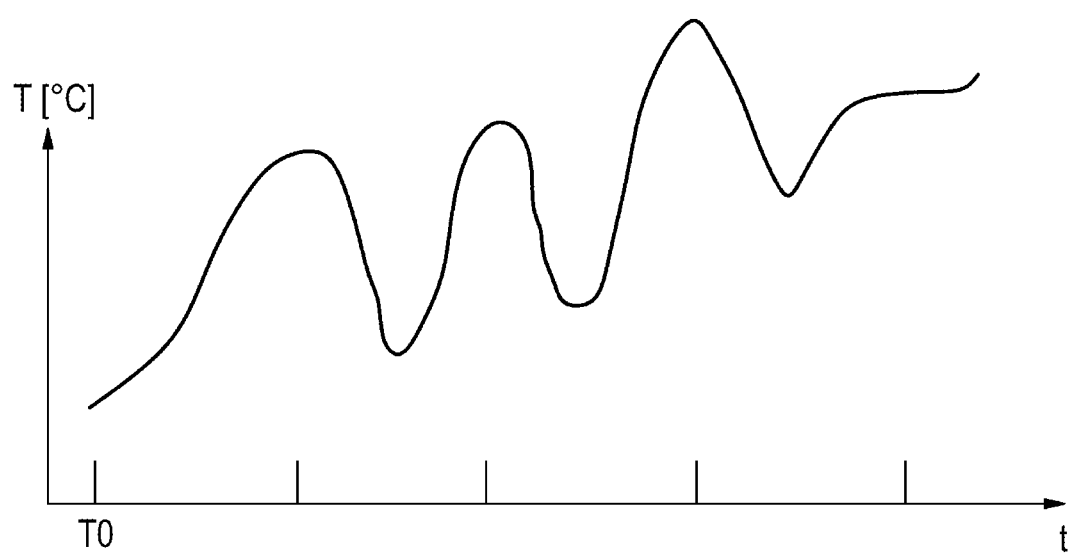
FIG. 6 shows an illustration of an exemplary schematic characteristic of the battery temperature as an operating variable under consideration.

At predetermined discrete times, a prediction of the state of health is made based on the characteristics, received up to that point, of operating variables in accordance with the above-described hybrid state of health model 9, in order to ascertain or to predict a state of health for the current evaluation period or the current time. When a characteristic of the state of health is to be predicted, a characteristic of at least one loading variable or at least one operating variable or the abovementioned operating variables, as described above, is determined based on the usage pattern model 10 for a particular vehicle in a vehicle-specific manner. By way of example, FIG. 6 shows one possible characteristic of the battery temperature starting from a present evaluation period TO.

In a following step S13, past predictions, which may be created with the aid of the usage pattern model 10, are then assessed. For this purpose, a check is performed as to how a prediction, made in relation to a past evaluation period, of a characteristic of the loading variables or operating variables corresponds to the characteristics, actually received from the vehicle 4 in question, of the operating variables.

This analysis is preferably performed on the basis of a constant forecast horizon. It is furthermore assumed that the driver or the usage type of the vehicle battery 41 will also be able to be predicted in the future with a similar confidence on the identical forecast horizon in relation to its usage pattern, that is to say the loading and/or operating variables, for example comprising time and temperature. Historical usage pattern confidences are learned on at least one forecast horizon, but preferably on multiple, for example ten forecast horizons, usually discretized between 1 month and 15 years.

Figure 7:
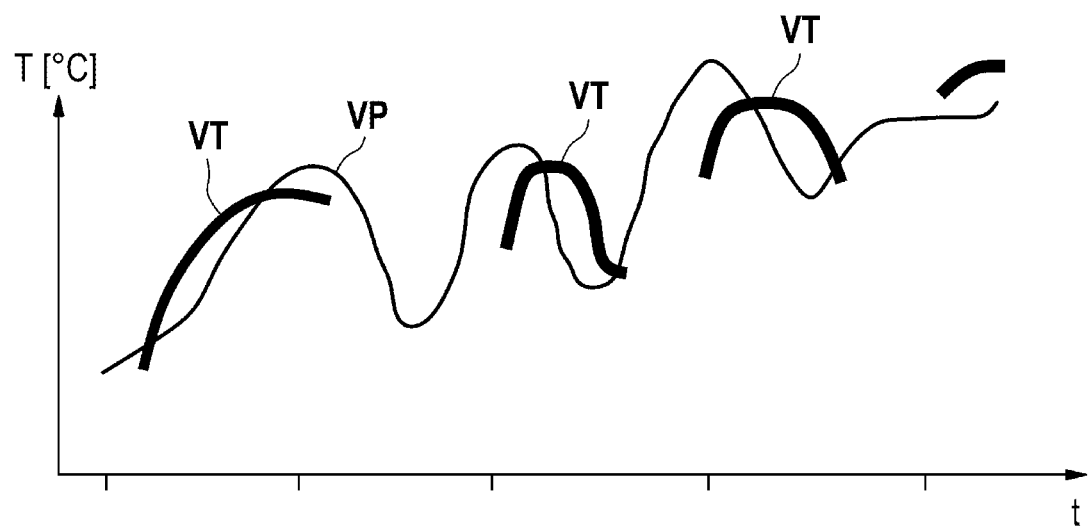
FIG. 7 shows a graph of an exemplary schematic characteristic of the battery temperature as the operating variable under consideration for a past observation period with a characteristic, predicted by the usage pattern model, of the battery temperature and with time periods of an actual characteristic of the battery temperature.

In FIG. 7, by way of example, a characteristic VP, predicted by the usage pattern model 10, of the battery temperature and time intervals for an actual characteristic VT of the battery temperature are plotted on the basis of operating variables of the battery temperature for a past observation period. Since the vehicle or the vehicle battery 41 is not in continuous operation, the actual characteristic of the battery temperature is not continuously available. Whenever a battery temperature or a current strength has been measured or observed during operation, however, another relevant label for the usage pattern model is available, which may furthermore also be used to assess the predicted characteristic of the one or more loading variables and/or one or more operating variables.

A check is then performed as to the extent to which the forecast (predicted) characteristic corresponds to the actual characteristic of the predicted loading variables, comprising for example temperature and current.

For this purpose, for one or more constant forecast horizons, a respective predicted characteristic of the operating variable under consideration is ascertained after the respective constant forecast horizon. In other words, in order to ascertain the predicted characteristic of the loading variable L or operating variable F under consideration, for temporally successive forecast target times, which correspond to an evaluation period or an identical time increment (for example 3 years) in a past observation period and which indicate the predicted characteristic, a respective value of the operating variable under consideration is predicted based on a characteristic of the operating variable under consideration up to a forecast start time with the aid of the usage pattern model 10. The duration between the forecast start time and the forecast target time corresponds to the constant forecast horizon. The forecast start time thus corresponds to an evaluation period/time (start of the prediction) that lies the predefined constant forecast horizon in the past in relation to the evaluation period/time under consideration.

The predicted characteristic of the operating variable under consideration is ascertained for the past observation period, which preferably ends at the present evaluation period/time. In the past observation period, which may start for example at the time of commissioning of the energy store, all of the predictions with the constant forecast horizon (for example 3 years) are then compiled to form a load prediction vector with a constant forecast horizon.

Through comparison with the real measured or observed characteristic of the one or more loading variables and/or one or more operating variables, for example the temperature, the residual of the prediction of the one or more loading variables and/or one or more operating variables in question is able to be determined accurately.

The applied usage pattern model 10 is generally data-based and is trained, as described above, with known characteristics of the actual operating variable under consideration in a vehicle-specific manner for the vehicle under consideration. As usage pattern model 10 for determining the predicted characteristic of the operating variable under consideration, it is in particular always possible to adopt a model for whose training only characteristics of the operating variable under consideration up to the respective forecast start time taken into consideration (start of the prediction) are taken into consideration. In other words, in order to ascertain the respective predicted characteristic of the operating variable under consideration, a multiplicity of usage pattern models are used, these being selected according to the forecast start time.

Figure 8:
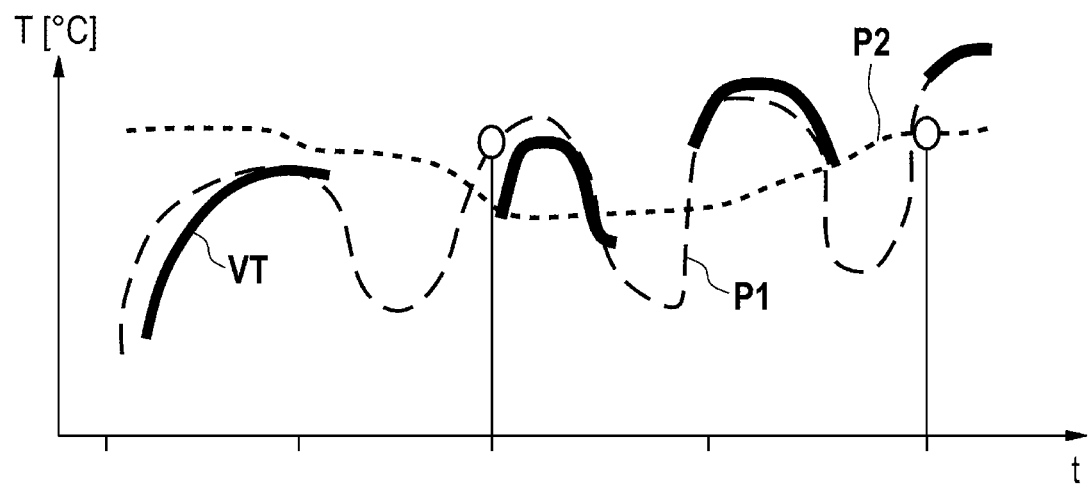
FIG. 8 shows a graph of exemplary predicted schematic characteristics of the operating variable under consideration for two different forecast horizons.

The resulting predicted characteristics of the operating variable under consideration are illustrated by way of example in FIG. 8 for two different forecast horizons. The dotted curve P2 shows the predicted values of the operating variable under consideration that have been predicted for a longer forecast horizon of for example 5 days, and the dashed curve shows the predicted values of the operating variable under consideration that have been predicted for a shorter forecast horizon P1. In comparison with the sections of the actual characteristic VT of the operating variable under consideration, it may be seen that the usage pattern model 10 for a shorter forecast horizon is able to predict the characteristic of the operating variable better than is the case for the prediction in relation to a longer forecast horizon.

In step S14, it is then evaluated how well the prediction for different forecast horizons was made in relation to the time intervals for which there is an actual characteristic of operating variables. By way of example, for each forecast horizon, a complete error residual or error histogram may thus be created from the respective predicted values of the one or more loading variables and/or one or more operating variables under consideration for the evaluation periods or time steps in a defined evaluation interval. The error residuals result for example, for each evaluation period or time step in a defined evaluation interval, in the form of a deviation between the corresponding value of the operating variable under consideration and the actual value of the operating variable under consideration. The defined evaluation interval may correspond to the observation period. The evaluation period since the commissioning of the energy store or since the last driver change up to the present is usually defined.

The evaluation of the error residuals in relation to the actually measured operating variables and the predicted operating variables may take place over a time window that is only a short time in the past, such as for example the last seven days, or take place over another period between one day and one month up to several years. In this case, historical data are used to learn and establish how the residuals for a particular constant forecast horizon are distributed within the defined time window for a particular user or a particular usage type.

In a following step S15, based on the ascertained residual, which is assigned to a forecast horizon, for a past predefined period, in particular up to the start of the commissioning of the vehicle battery or since the last driver change, the error residuals are evaluated analytically in accordance with a histogram. Based on the residual, a probability density function is fitted, this being able to be assigned unambiguously to a forecast horizon and characterizing the uncertainty of the usage pattern prediction in a driver-specific manner. The probability density function may for example be fitted based on a normal distribution or in a non-parametric manner. This results in a complete error residual image for the prediction horizon of for example 3 years, for which a probability density function is able to be fitted, assuming for example a normal distribution, by way of the residual histogram. The probability density function for the operating variable under consideration and for the constant forecast horizon under consideration then makes it possible to perform an assessment as to how stochastically or how deterministically the vehicle battery is used by the driver.

Figure 9:
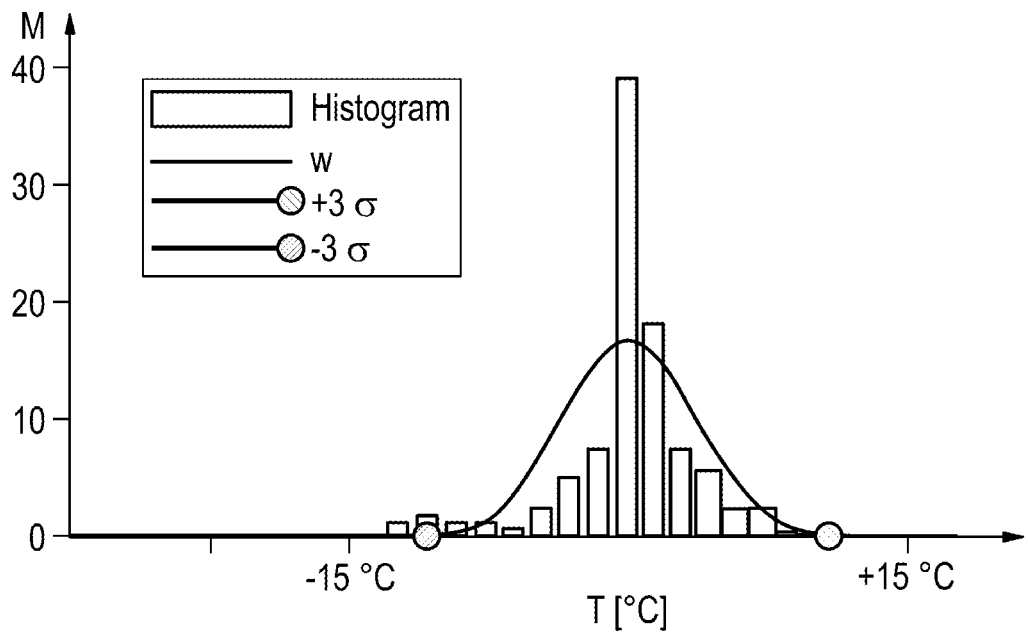
FIG. 9 shows a histogram for illustrating an error residual for a constant 5-day forecast horizon in relation to the battery temperature as operating variable under consideration.

By way of example, FIG. 9 illustrates a histogram (frequencies H) for an error residual for a constant 5-day forecast horizon in relation to the battery temperature as operating variable under consideration. It may be seen in the example of FIG. 9 that the residual of the battery temperature, as a first approximation, is distributed normally (in accordance with the probability distribution W) and fluctuates between roughly −12° C. and +12° C. for a constant forecast horizon of fifty days. A historical uncertainty of the operating variable under consideration is determined in the form of a maximum deviation that is stored with probabilities, such as for example ±12° C. deviation in the case of a constant forecast horizon of fifty days with a confidence of 99%, ±16° C. deviation in the case of a constant forecast horizon of 100 days with 99% confidence, and ±20° C. deviation in the case of a constant forecast horizon of three years with a confidence of 99%.

It should furthermore be checked and ensured that the residual does not lie precisely in the edge region of the global fleet residual. If this is the case and especially in the case of a strongly increasing uncertainty on the same forecast horizon (for example 3 years), retraining of the driver-specific or usage-specific usage pattern model 10 is initiated such that the newest residuals then do not lie in the edge region of the historical residuals. As an alternative to training, a systematic residual offset may also be learned and then compensated for in an additive manner.

In a following step S16, starting from the present evaluation period, a prediction of the state of health is then performed based on the most up-to-date usage pattern model 10. This results in a nominal predicted characteristic of the state of health. Using the hybrid state of health model also gives, in addition to the predicted characteristic of the state of health, a confidence interval in relation to a predefined, for example 99% confidence of the model estimate of the hybrid state of health model, preferably derived directly from the Gaussian process model.

It is then possible, in a step S17, to ascertain predicted characteristics for the state of health with the aid of the previously determined maximum deviations of the operating variables for different forecast horizons. In this case, predicted characteristics for the minimum and maximum loading or stress factors of the vehicle battery are intended to be ascertained. This is performed by calculating predicted characteristics of the state of health with modified characteristics of one or more of the operating variables. To this end, the original predicted characteristic of one or more of the operating variables has applied to it the previously ascertained deviations resulting for the operating variables under consideration for the forecast horizon. The maximum deviations of the operating variables respectively under consideration are added or subtracted in accordance with the predicted characteristic of the corresponding operating variable. In the case of a deviation of for example +/−12° C., the predicted characteristic of the battery temperature is thus shifted by +/−12° C. in order to be able to describe minimum and maximum temperature-induced usage patterns.

As an alternative, sampling may also be performed using a Monte Carlo method, for example with a sample of n=80, in order for example to combine the uncertainty of the temperature prediction with the uncertainty of the current prediction and to stimulate the hybrid state of health model at input. Sampling may be performed here from the learned distribution, in accordance with FIG. 9.

Furthermore, in step S18, a minimum prediction of the characteristic of the operating variables under consideration and a maximum prediction of the characteristic of the operating variables under consideration are performed. To this end, the characteristic of the operating variables, battery current and battery temperature, are ascertained in accordance with the usage pattern model 10. In this regard, in relation to the multiple forecast horizons under consideration, the corresponding maximum deviations are taken into consideration as a confidence interval for the prediction of the characteristic of the state of health. The maximum deviation taken into consideration may be interpolated between the forecast horizons for which the maximum deviations are present.

Figure 10:
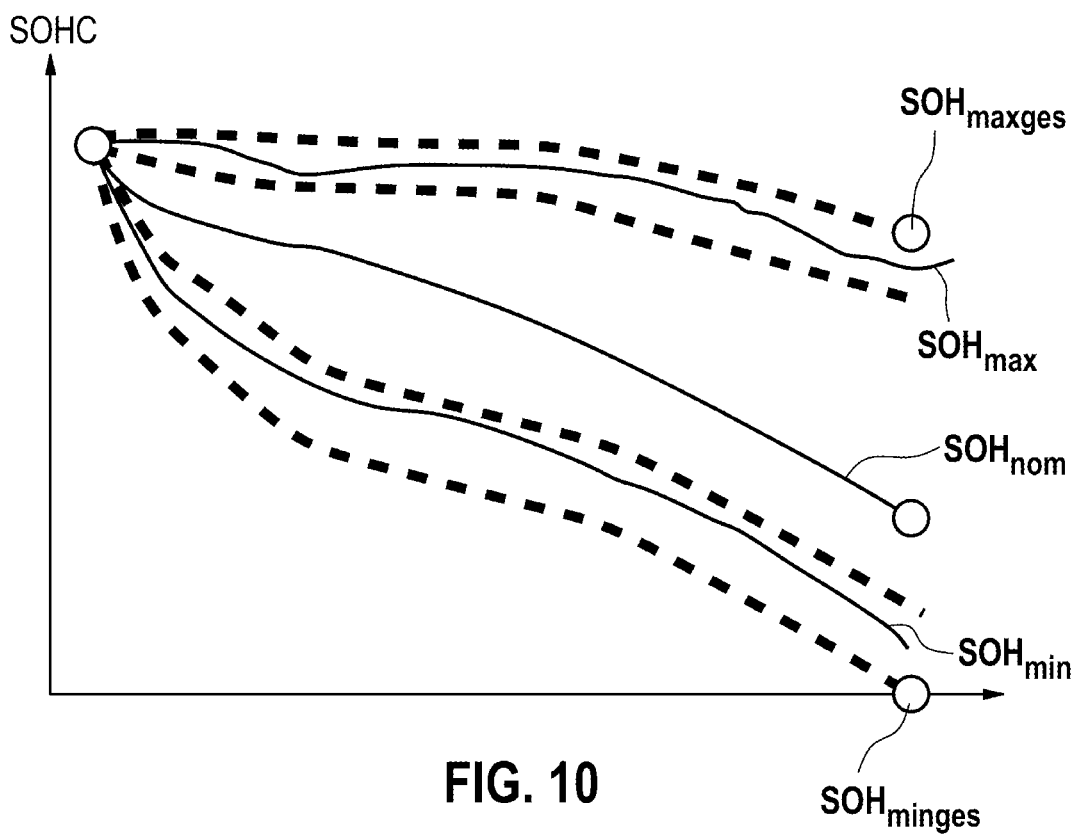
FIG. 10 shows a graph for illustrating predicted characteristics of the limit state of health and the predicted characteristics of the states of health for the minimum and maximum loading of the vehicle battery to illustrate the confidence intervals.

In other words, at least the negative maximum deviation of the battery temperature and the negative maximum deviation of the battery current, the positive maximum deviation of the battery temperature and the negative maximum deviation of the battery current, the negative maximum deviation of the battery temperature and the positive maximum deviation of the battery current and the positive maximum deviation of the battery temperature and the positive maximum deviation of the battery current are ascertained on the characteristic of the battery current predicted in a model-based manner and the battery temperature for each forecast horizon under consideration. This results in multiple trajectories for the characteristic of the state of health, such as for example from FIG. 10 with the curves $SOH_{nom}$ for the nominal state of health characteristic, $SOH_{min}$ for the state of health characteristic with minimum loading of the vehicle battery 41 and $SOH_{max}$ for the state of health characteristic with maximum loading of the vehicle battery 41. Starting from the nominal state of health prediction with the negative and positive maximum deviations of the operating variables, consideration is thus given to that state of health trajectory that indicates minimum loading of the vehicle battery and that state of health trajectory that indicates maximum loading of the vehicle battery.

In accordance with the data-based hybrid state of health model 9, in step S19, the modeling uncertainties may then additionally be ascertained in the form of a confidence interval around the state of health characteristic $SOH_{nom}$ for the nominal state of health characteristic, the state of health characteristic $SOH_{min}$ with minimum loading of the vehicle battery 41 and the state of health characteristic $SOH_{max}$ with maximum loading of the vehicle battery 41. These are illustrated in the form of dotted limit state of health characteristics $SOH_{maxges}$, $SOH_{minges}$ around the corresponding state of health characteristics $SOH_{max}$, $SOH_{min}$ for the maximum and minimum loading of the vehicle battery 41.

The respective confidence interval limits, which result from the overall state of health characteristics $SOH_{maxges}$, $SOH_{minges}$ thus ascertained with the combined uncertainties from the usage pattern model 10 and the hybrid state of health model 9, correspond to those trajectories that are furthest away from the nominal state of health trajectory. These define the confidence interval for the nominal state of health trajectory. This takes into consideration both the modeling uncertainty of the hybrid state of health model 9 and the modeling uncertainty of the usage pattern model 10. It is thus ensured that drivers who act deterministically, such as for example in public transport, are able to be predicted very precisely in relation to usage patterns and loads, which may be used directly for an accurate state of health prediction and to calculate the remaining service life. This means that, in the case of sufficiently narrow confidence, predictive maintenance intervals are able to be scheduled efficiently and performed very effectively for vehicle batteries that are used deterministically.

In step S20, the nominal predicted state of health trajectory and the associated confidence interval are signaled.

The remaining service life is determined using the time at which the characteristic of the predicted state of health reaches a predefined state of health threshold value, such as for example 80% SOH. The confidence interval resulting for the prediction of the state of health characteristic in accordance with the above method then makes it possible to indicate an appropriate interval for the provisional remaining service life based on the joint uncertainties of the usage pattern model and the hybrid state of health model 9. The uncertainty range for the predicted remaining service life is ascertained by indicating those times at which the predicted state of health characteristics $SOH_{maxges}$, $SOH_{minges}$ for the maximum and minimum loading exceed the predefined state of health threshold value, such as for example 80% SOH.

What is claimed is:

1. A computer-implemented method for predicting a modeled state of health of an electrical energy store having at least one electrochemical unit in a technical device, the computer-implemented method comprising:
   providing a data-based state of health model, based on a characteristic of at least one operating variable of the electrical energy store up to a time, to assign the electrical energy store a corresponding state of health for the time and to indicate a corresponding modeling uncertainty;
   predicting the characteristic of the at least one operating variable starting from a present time into a future based on a usage pattern model that is determined by a user-specific or usage-specific usage pattern;
   predicting a characteristic of the modeled state of health based on the data-based state of health model and the predicted characteristic of the at least one operating variable generated in a model-based manner; determining a
   confidence interval for the predicted characteristic of the modeled state of health based on the corresponding modeling uncertainty of the data-based state of health model and a confidence of the usage pattern model; and
   outputting the predicted characteristic of the modeled state of health and the confidence interval.

2. The computer-implemented method according to claim 1, wherein, in order to determine the predicted characteristic of the modeled state of health, the data-based state of health model is operated with an overall characteristic of the at least one operating variable that comprises a previous characteristic of the at least one operating variable up to the present time and the predicted characteristic of the at least one operating variable generated in the model-based manner starting from the present time into the future.

3. The computer-implemented method according to claim 1, wherein the usage pattern model is configured as a Bayesian long short-term memory in order, based on usage parameters of the user-specific or usage-specific usage pattern, to continuously provide the predicted characteristic of the at least one operating variable or a predicted characteristic of at least one loading variable from which the at least one operating variable is generated.

4. The computer-implemented method according to claim 1, wherein the confidence of the usage pattern model is determined based on an uncertainty of the prediction of the characteristic of the at least one operating variable generated in the model-based manner.

5. The computer-implemented method according to claim 1, wherein:
   a confidence of the prediction of the characteristic of the at least one operating variable is ascertained based on characteristics of the at least one operating variable that are acquired in a past,
   the confidence of the usage pattern model is ascertained by comparing a time period of an actual characteristic of the at least one operating variable with one or more predicted characteristics of the at least one operating variable for the time period, and
   the one or more predicted characteristics of the at least one operating variable is or are performed in each case for a constant forecast horizon.

6. The computer-implemented method according to claim 5, wherein:
   the one or more predicted characteristics of the at least one operating variable are each formed by values of the at least one operating variable at forecast target times that are ascertained based on a respective usage pattern model that is trained with the actual characteristic of the at least one operating variable up to a corresponding forecast start time, and
   forecast start times lie before corresponding forecast target times by a corresponding constant forecast horizon.

7. The computer-implemented method according to claim 5, wherein the confidence of the usage pattern model is determined based on a probability density function of deviations of the actual characteristic of the at least one operating variable and one of the one or more predicted characteristics of the at least one operating variable for the time period.

8. The computer-implemented method according to claim 7, wherein:
   the confidence of the usage pattern model is determined in a form of a characteristic of the deviations based on the actual characteristic of the at least one operating variable and the one or more predicted characteristics of the at least one operating variable for the time period for different constant forecast horizons, and the deviations between the different constant forecast horizons are interpolated in order to obtain the characteristic of the deviations based on a forecast time of a value of the modeled state of health to be predicted.

9. The computer-implemented method according to claim 5, wherein:
   the confidence interval for the predicted characteristic of the modeled state of health is indicated by confidence interval limits that result from limit state of health characteristics,
   the limit state of health characteristics result from state of health characteristics for a minimum and a maximum loading of the electrical energy store that are obtained by applying characteristics of maximum deviations to the predicted characteristic of the at least one operating variable and that are each those that are furthest away from a nominal state of health trajectory, and
   the corresponding modeling uncertainty of the data-based state of health model is applied to the state of health characteristics thus obtained for the minimum and the maximum loading of the electrical energy store in order to obtain the limit state of health characteristics.

10. The computer-implemented method according to claim 1, wherein:
    the data-based state of health model is a hybrid model and comprises a physical ageing model based on electrochemical model equations and configured to output a physical state of health and a trainable data-based correction model, and
    the trainable data-based correction model is trained to correct the physical state of health and to provide a corrected physical state of health as the corresponding state of health and the corresponding modeling uncertainty.

11. The computer-implemented method according to claim 1, wherein:
    the electrical energy store is operated based on the predicted characteristic of the modeled state of health and based on the confidence interval,
    a remaining service life of the electrical energy store is signaled based on the predicted characteristic of the modeled state of health and/or a range of a possible remaining service life is signaled based on the predicted characteristic of the modeled state of health and the confidence interval, and
    a number of remaining permitted fast-charging cycles is increased or reduced, or current and derating limits for operation of the electrical energy store are optimized based on the range of the possible remaining service life of the electrical energy store.

12. The computer-implemented method according to claim 1, wherein predictive maintenance intervals of the technical device are adapted based on the confidence of the usage pattern model.

13. The computer-implemented method according to claim 1, wherein the electrical energy store is used to operate a device comprising a motor vehicle, a pedelec, an aircraft, a drone, a machine tool, a consumer electronics device, a cell phone, an autonomous robot, and/or a domestic appliance.

14. The computer-implemented method according to claim 1, wherein a computer program product comprises commands that, when the computer program product is executed by at least one data processing apparatus, cause the at least one data processing apparatus to perform the computer-implemented method.

15. The computer-implemented method according to claim 14, wherein a non-transitory machine-readable storage medium comprises commands that, when executed by at least one data processing apparatus, cause the at least one data processing apparatus to perform the computer-implemented method.

16. An apparatus predicts a modeled state of health of an electrical energy store having at least one electrochemical unit in a technical device, the apparatus configured to:
    provide a data-based state of health model, based on a characteristic of at least one operating variable of the electrical energy store up to a time, to assign the electrical energy store a corresponding state of health for the time and to indicate a corresponding modeling uncertainty;
    predict the characteristic of the at least one operating variable starting from a present time into a future based on a usage pattern model that is determined by a user-specific or usage- specific usage pattern;

predict a characteristic of the modeled state of health based on the data-based state of health model and the predicted characteristic of the at least one operating variable generated in a model-based manner;

determine a confidence interval for the predicted characteristic of the state of health based on the corresponding modeling uncertainty of the data-based state of health model and a determine a confidence interval for the predicted characteristic of the modeled state of health based on the corresponding modeling uncertainty of the data-based state of health model and a confidence of the usage pattern model; and output the predicted characteristic of the modeled state of health and the confidence interval.

* * * * *

UNITED STATES PATENT AND TRADEMARK OFFICE
CERTIFICATE OF CORRECTION

| | | |
|---|---|---|
| PATENT NO. | : 12,366,610 B2 | Page 1 of 1 |
| APPLICATION NO. | : 17/812210 | |
| DATED | : July 22, 2025 | |
| INVENTOR(S) | : Simonis | |

It is certified that error appears in the above-identified patent and that said Letters Patent is hereby corrected as shown below:

In the Claims

In Claim 16, at Column 25, Line 6: "the state of health" should read --the modeled state of health--.

Signed and Sealed this
Twenty-third Day of December, 2025

John A. Squires
*Director of the United States Patent and Trademark Office*